United States Patent [19]

Matsuki

[11] Patent Number: 5,539,243
[45] Date of Patent: Jul. 23, 1996

[54] SEMICONDUCTOR DEVICE HAVING SPACES AND HAVING REDUCED PARASITIC CAPACITANCE

[75] Inventor: Junichi Matsuki, Yamagata, Japan

[73] Assignee: NEC Corporation, Tokyo, Japan

[21] Appl. No.: 285,554

[22] Filed: Aug. 3, 1994

[30] Foreign Application Priority Data

Aug. 3, 1993 [JP] Japan ................................. 5-191506

[51] Int. Cl.⁶ .................................................. H01L 23/48
[52] U.S. Cl. ........................... 257/584; 257/587; 257/760; 257/786
[58] Field of Search ................... 257/784, 786, 257/584, 587, 737, 758, 760

[56] References Cited

U.S. PATENT DOCUMENTS 5,189,505  2/1993  Bartelink ................................. 257/778

FOREIGN PATENT DOCUMENTS

| 0340727 | 11/1989 | European Pat. Off. ............... 257/786 |
| 0039378 | 3/1977 | Japan .................................... 257/786 |
| 0074731 | 3/1989 | Japan .................................... 257/786 |
| 0104029 | 7/1989 | Japan . |
| 0096243 | 4/1991 | Japan .................................... 257/786 |
| 2243485 | 10/1991 | United Kingdom ..................... 257/786 |

OTHER PUBLICATIONS

S. M. Sze, Semiconductor Devices/Physics & Technology 1986, p. 344.
Translation of Japan Kokai Publication #0074731 (Mar, 1989) to Okuzumi, 13 pages.

*Primary Examiner*—Peter Toby Brown
*Attorney, Agent, or Firm*—Popham, Haik, Schnobrich & Kaufman, Ltd.

[57] ABSTRACT

A semiconductor device containing a first electrode formed under an interlayer insulator film and a second electrode formed on or over the interlayer insulator film. The first electrode is connected to an active region formed at a semiconductor substrate. The second electrode acts as a bonding pad and is connected to the first electrode through the interlayer insulator film. Between the second electrode and the substrate, there is a capacitance-reduction structure composed of an insulator layer having a plurality of hollow spaces arranged at intervals. Due to the capacitance-reduction structure, the dielectric material existing between the second electrode and the substrate contains the hollow spaces therein, resulting in a reduced parasitic capacitance produced using the second electrode, substrate and the dielectric material.

5 Claims, 8 Drawing Sheets

SEMICONDUCTOR DEVICE HAVING SPACES AND HAVING REDUCED PARASITIC CAPACITANCE

BACKGROUND OF THE INVENTION

1. Field of the Invention

The present invention relates to a semiconductor device and more particularly, to a semiconductor device which has a first electrode disposed below an interlayer insulator film and a second electrode disposed on the interlayer insulator film and connected to the first electrode through the interlayer insulator film, the first electrode being electrically connected to an active region and the second electrode acting as a bonding pad.

2. Description of the Prior Art

A conventional semiconductor device having the above-described structure is shown in FIGS. 1 and 2, which is disclosed in the JAPANESE NON-EXAMINED UTILITY MODEL PUBLICATION NO. 1-104029.

As shown in FIG. 1, there are a first electrode 53a branched into three portions and a second electrode 55a of a circular shape on the right side, and a first electrode 53b branched into two portions and a second electrode 55b of a circular shape on the left side.

The three branches of the first electrode 53a are electrically connected to a base region 51 of a bipolar transistor formed in a silicon (Si) substrate 56. The base region 51 is formed in an active region of the substrate 56 and is right below the branches of the first electrode 53a.

The two branches of the first electrode 53b are electrically connected to two emitter regions 52, respectively. The emitter regions 52 are formed in the base region 51 and is right below the branches of the first electrode 53b, respectively.

The second electrodes 55a and 55b act as bonding pads for wire bonding, respectively.

As shown in FIG. 2, the second electrode 55a is formed on an interlayer insulator film 54 of silicon dioxide ($SiO_2$) and the first electrode 53a is formed under the film 54. The protrusion of the second electrode 55a is superposed on the base or root of the first electrode 53a, and at the superposed area, the first and second electrodes 53a and 55a are in contact with each other through a contact hole 58a formed in the interlayer insulator film 54. Thus, the first and second electrodes 53a and 55a are electrically connected with each other.

Similarly, the second electrode 55b on the left side of FIG. 1 is also formed on the $SiO_2$ interlayer insulator film 54 and the first electrode 53b is formed under the film 54. The protrusion of the second electrode 55b is superposed on the base or root of the first electrode 53b, and at the superposed area, the first and second electrodes 53b and 55b are in contact with each other through a contact hole 58b formed in the interlayer insulator film 54. Thus, the first and second electrodes 53b and 55b are electrically connected with each other.

The second electrode 55a has a plurality of square openings or apertures 57a arranged in a matrix array. The openings 57a act to reduce the parasitic capacitance between the second electrode 55a and a silicon (Si) substrate 56. This is due to the fact that there arises spaces between the second electrode 55a and the substrate 56 and when a bonding wire is bonded to the second electrode 55a by wire bonding, resulting in a reduced contact area therebetween.

The second electrode 55b on the left side of FIG. 1 also has a plurality of square openings or apertures 57b arranged in a matrix array. The openings 57b also act to reduce the parasitic capacitance between the second electrode 55b and the substrate 56.

On the substrate 56, there are provided a thick $SiO_2$ film 64 with a thickness of about 1.5 μm and a thin $SiO_2$ film 61 with a thickness of about 700 Å. The thick film 64 is disposed below the second electrode 55a and is produced by low-pressure chemical vapor deposition (LPCVD). The thin film 61 is disposed below the first electrode 53a and is produced by thermal oxidation of the substrate 56.

A silicon nitride ($Si_3N_4$) film 73 is formed to cover the $SiO_2$ films 64 and 61, and the first electrodes 53a and 53b are provided on the $Si_3N_4$ film 73.

The conventional semiconductor device described above is fabricated by the following process sequence:

First, as shown in FIG. 3A, the Si substrate 56 is oxidized thermally to grow an $SiO_2$ film 61 with a thickness of about 700 Å on the entire surface of the substrate 56.

Next, an $Si_3N_4$ film 71 with a thickness of about 1500 Å is formed on the entirety of the $SiO_2$ film 71 by LPCVD, and then, the $Si_3N_4$ film 71 is patterned by photolithography and etching to selectively remove its part where the surface of the substrate 56 is oxidized in the next process step.

The substrate 56 is thermally oxidized again using the patterned $Si_3N_4$ film 71 as a mask so that the $SiO_2$ film 61 selectively grows to be an $SiO_2$ film 62 with a thickness of 1.5 μm on the area where the patterned $Si_3N_4$ film 71 does not exist. Since the $SiO_2$ film 61 usually grows both upper and lower directions, the $Si_3N_4$ film 71 is lifted at the end of the area, as shown in FIG. 3B. The part of the $SiO_2$ film 61 under the $Si_3N_4$ film 71 does not grow.

The $SiO_2$ film 62 thus grown is then removed by etching using the patterned $Si_3N_4$ film 71 as a mask. Since the $SiO_2$ film 61 has grown in both the upper and lower directions at the same rate, the surface of the area where the $SiO_2$ film 62 has been removed is lower than the original surface of the substrate 56 by about 0.75 μm. The state at this time is shown in FIG. 3C.

Subsequently, the substrate 56 is thermally oxidized for a third time to grow an $SiO_2$ film 73 with a thickness of 700 Å over the substrate 56, and an $Si_3N_4$ film 72 with a thickness of about 500 Å is grown on the entirety of the $SiO_2$ film 73 thus grown by LPCVD, as shown in FIG. 3D.

The $Si_3N_4$ film 72 is removed by anisotropic etching. The part of the $Si_3N_4$ film 72 disposed under the lifted end of the $Si_3N_4$ film 71 is left, as shown in FIG. 3E.

The substrate 56 is then thermally oxidized for a fourth time. Thus, the $SiO_2$ film 63 on the depressed surface area of the substrate 56 grows selectively to be an $SiO_2$ film 64 with a thickness of about 1.5 μm. After that, the $SiO_2$ film 63 and the $Si_3N_4$ films 71 and 72 are removed by etching.

The state of this time is shown in FIG. 3G, where the thick $SiO_2$ film 64 is on the depressed surface area of the substrate 56 and is connected to the thin $SiO_2$ film 61.

Subsequently, as shown in FIG. 3H, an $Si_3N_4$ film 73 with a thickness of about 500 Å is grown over the substrate 56 by LPCVD to cover the $SiO_2$ films 61 and 64. Then, the first electrodes 53a and 53b are provided on the $Si_3N_4$ film 73 by metallization and patterning to be electrically connected with the base region 51 and the emitter regions 52 in the substrate 56 through contact holes (not shown) of the $Si_3N_4$ film 73 and the $SiO_2$ film 61, respectively.

An $Si_3N_4$ film 54 with a thickness of about 1 μm is grown over the substrate 56 by LPCVD as an interlayer insulator film and the contact holes 58a and 58b are formed in the $Si_3N_4$ film 54.

Finally, the second electrodes 55a and 55b with the square openings or apertures 57a are formed on the $Si_3N_4$ interlayer insulator film 54 by metallization and patterning. The second electrodes 55a and 55b are interconnected with the first electrodes 53a and 53b through the contact holes 58a and 58b, respectively.

Thus, the conventional semiconductor device shown in FIGS. 1 and 2 is obtained.

With the conventional semiconductor device described above, there is a problem that the parasitic capacitances between the second electrodes 55a and 55b and the substrate 56 become large, causing deterioration in high-frequency characteristic of the transistor. This problem appears remarkably for an extra high-frequency transistor.

There is another problem that since the contact areas between the bonding wires and the second electrodes 55a and 55b decrease due to the openings 57a and 57b, the bonding wires cannot be bonded with sufficient adhesion strength.

There is still another problem that the openings 57a and 57b tend to be crushed by the pressure on wire-bonding due to the openings 57a and 57b.

SUMMARY OF THE INVENTION

Accordingly, an object of the present invention is to provide a semiconductor device in which the parasitic capacitance between an electrode as a bonding pad and a semiconductor substrate can be reduced so that the high-frequency characteristic of the device is improved.

Another object of the present invention is to provide a semiconductor device in which the bonding wires can be bonded to the electrode as the bonding pad with sufficient adhesion strength.

Still another object of the present invention is to provide a semiconductor device in which the electrode as the bonding pad is extremely difficult to be damaged on wire-bonding.

A semiconductor device according to the present invention contains an interlayer insulator film formed at a semiconductor substrate, a first electrode formed under the interlayer insulator film, and a second electrode formed on or over said interlayer insulator film. The first electrode is connected to an active region formed at the substrate. The second electrode acts as a bonding pad and is connected to the first electrode through the interlayer insulator film.

There is a capacitance-reduction structure between the second electrode and the substrate, and the structure is composed of an insulator layer having a plurality of hollow spaces arranged at intervals. The parasitic capacitance produced using the second electrode and the substrate is reduced by the capacitance-reduction structure.

The hollow spaces of the insulator layer may be any type of The hollow spaces, such as gaps, cavities, and voids.

The capacitance-reduction structure needs to be placed between the second electrode and the substrate, however, the structure may be provided in an upper or lower position relative to interlayer insulator film.

Preferably, a structure is in the lower position than the interlayer insulator film.

The number, shape and arrangement of the hollow gaps or spaces of the layer may be optionally determined. For example, each of the hollow gaps or spaces has a planar shape of a rectangular, square, circular, strip or slit.

With the semiconductor device according to the present invention, a capacitance-reduction structure composed of a layer having a plurality of hollow gaps or spaces (cavities, voids) arranged at intervals is provided between the second electrode and the substrate. Therefore, the dielectric material existing between the second electrode and the substrate contains the hollow gaps or spaces therein.

As a result, the parasitic capacitor composed of the second electrode, the substrate and the dielectric material existing therebetween has a decreased capacitance compared with the case in which the dielectric material contains no hollow spaces.

Since the capacitance-reduction effect due to the dielectric material reduction in the invention is superior to that due to the electrode area reduction as shown in the conventional semiconductor device, the obtainable parasitic capacitance becomes less than that of the conventional one, providing improvement in high-frequency characteristic of the device.

In addition, since the second electrode has no opening, the bonding wires can be bonded to the second electrode as the bonding pad with sufficient adhesion strength.

Further, the second electrode is extremely difficult to be damaged on wire-bonding due to no opening.

DESCRIPTION OF THE PREFERRED EMBODIMENTS

Figure 1:
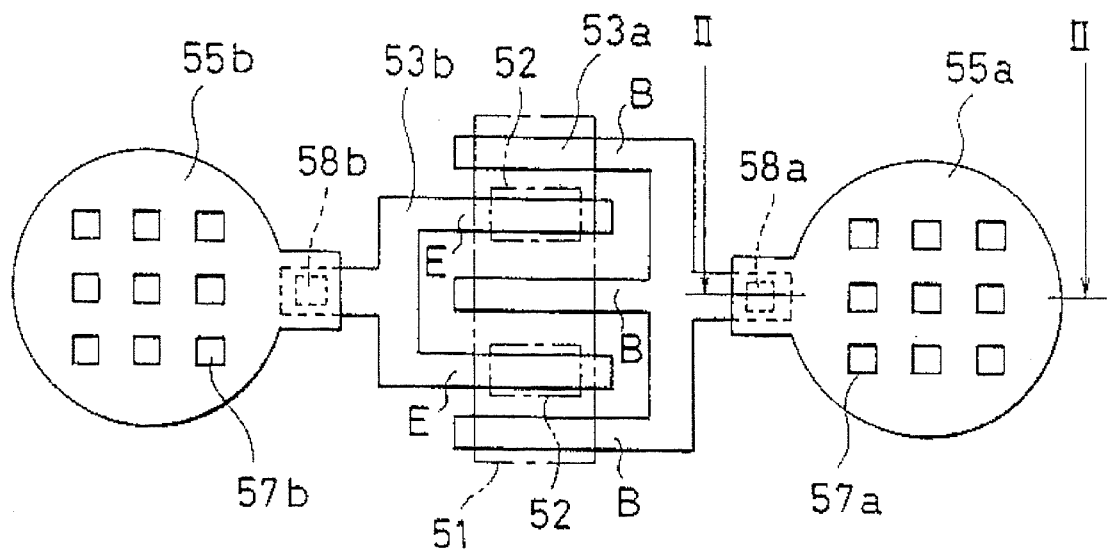
FIG. 1 shows a layout of first and second electrodes and an active region of a conventional semiconductor device.

Preferred embodiments of the present invention will be described below while referring to the drawings attached.
[First Embodiment]

Figure 4:
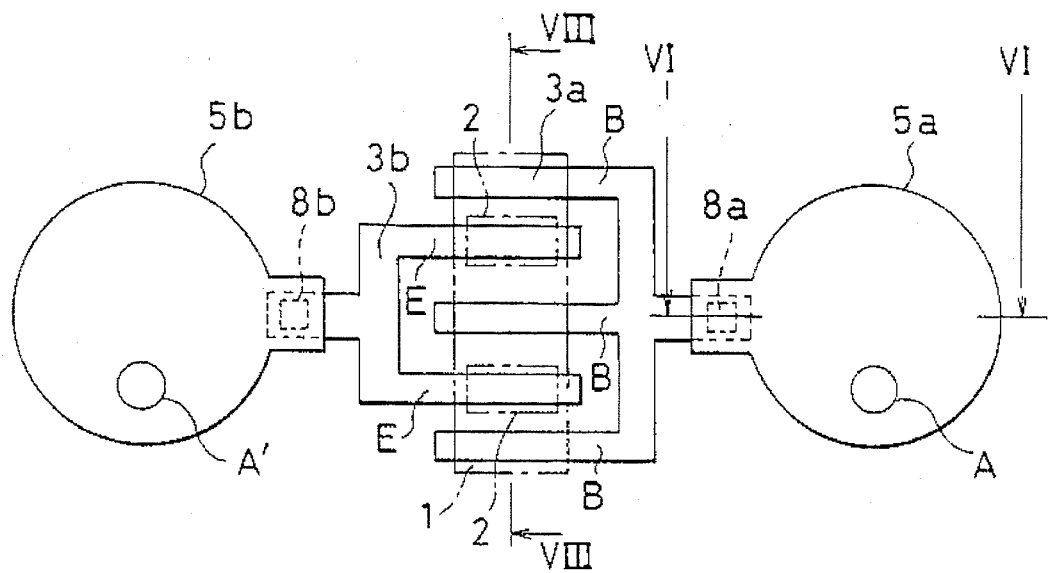
FIG. 4 shows a layout of first and second electrodes and an active region of a semiconductor device according to a first embodiment of the present invention.
Figure 5:
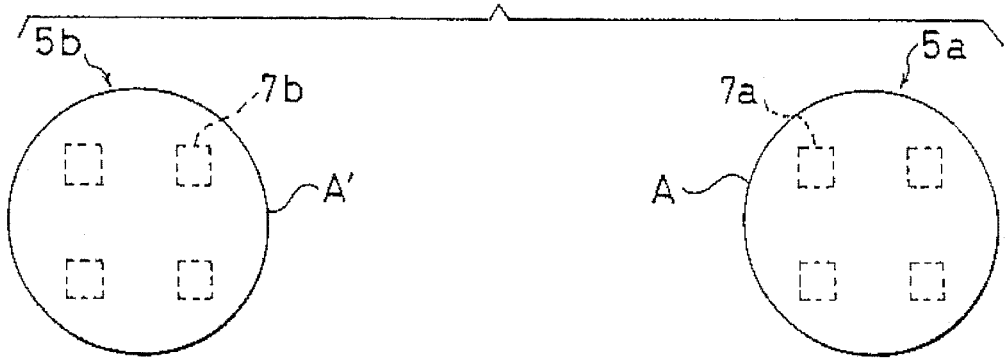
FIG. 5 shows enlarged plan views of the parts A and A' in FIG. 4

As shown in FIG. 4, there are a first electrode 3a branched into three portions and a second electrode 5a of a circular shape on the right side, and a first electrode 3b branched into two portions and a second electrode 5b of a circular shape on the left side.

Figure 8:
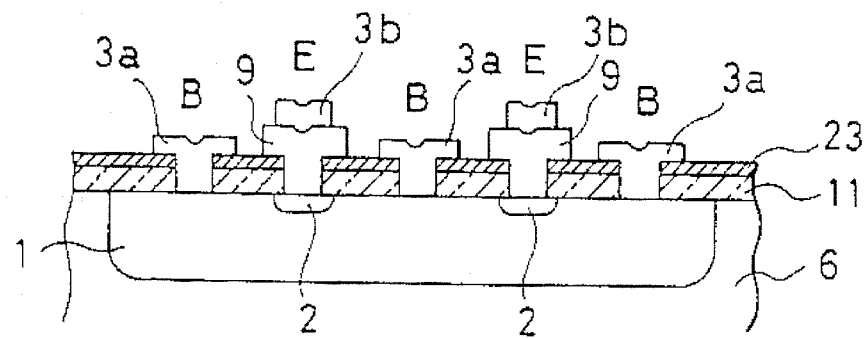
FIG. 8 is a cross-sectional view along the line VIII—VIII in FIG. 4.

As shown in FIG. 8, a base region 1 is formed in a Si substrate 6 and two emitter regions 2 are formed in the base region 1. A collector region is not shown here. The base region 1, the emitter regions 2 and the collector region are formed in an active region of the substrate 6 and constitute an extra high-frequency bipolar transistor.

The three branches of the first electrode 3a are electrically connected to the base region 1 which is right below the branches of the first electrode 3a.

The two branches of the first electrode 3b are electrically connected to the two emitter regions 2, respectively which are is right below the branches of the first electrode 3b, respectively.

The second electrodes 5a and 5b act as bonding pads for wire bonding, respectively.

Figure 6:
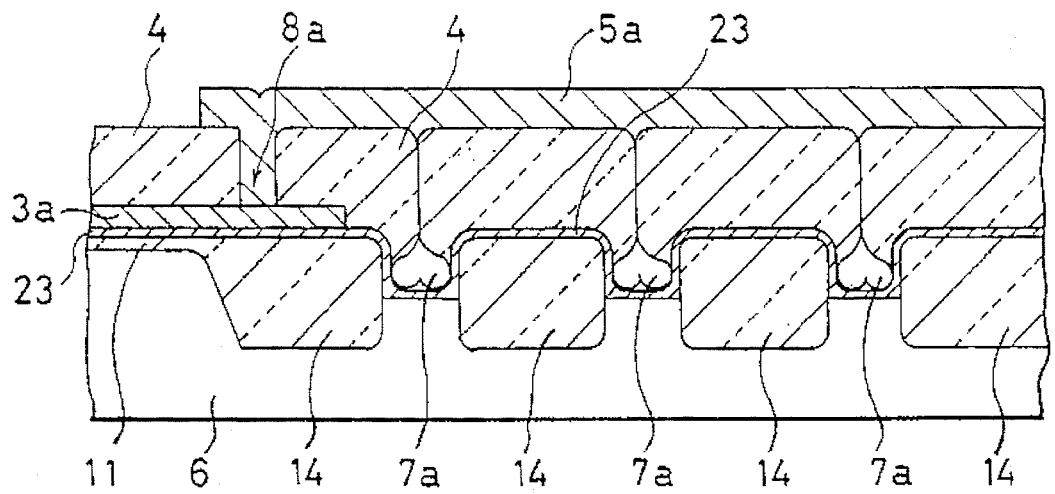
FIG. 6 is a cross-sectional view along the line VI—VI in FIG. 4.

As shown in FIG. 6, the second electrode 5a on the right side of FIG. 4 is formed on an interlayer insulator film 4 of $SiO_2$ and the first electrode 3a is formed under the film 4. The protrusion of the second electrode 5a is superposed on the base or root of the first electrode 3a, and at the superposed area, the first and second electrodes 3a and 5a are in contact with each other through a contact hole 8a formed in the interlayer insulator film 4. Thus, the first and second electrodes 3a and 5a are electrically connected with each other.

Similarly, the second electrode 5b on the left side of FIG. 4 is also formed on the $SiO_2$ interlayer insulator film 4 and the first electrode 3b is formed under the film 4. The protrusion of the second electrode 5b is superposed on the base or root of the first electrode 3b, and at the superposed area, the first and second electrodes 3b and 5b are in contact with each other through a contact hole 8b formed in the interlayer insulator film 4. Thus, the first and second electrodes 3b and 5b are electrically connected with each other.

Figure 2:
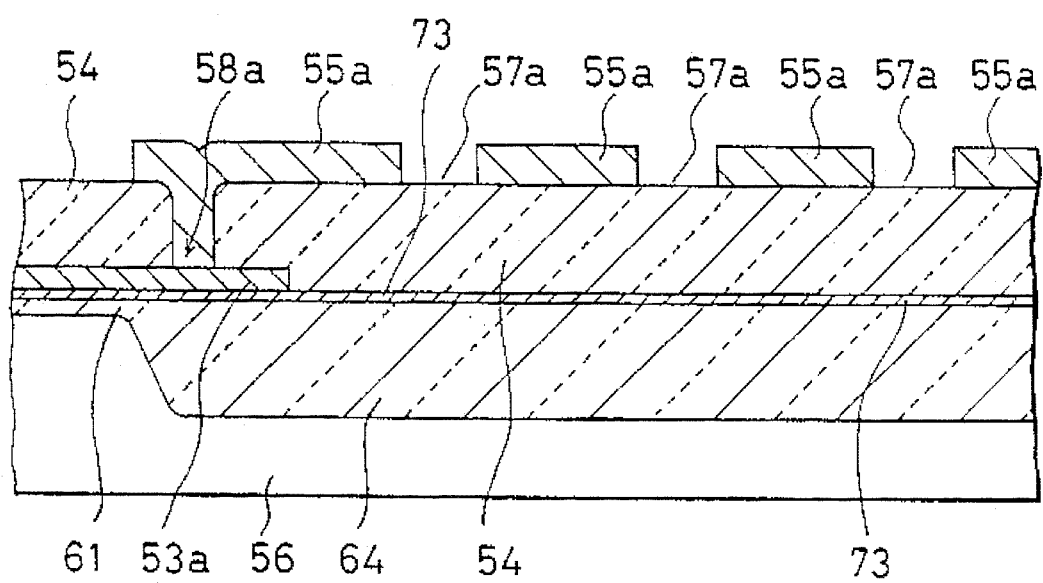
FIG. 2 is a cross-sectional view along the line II—II in FIG. 1
Figure 3A:
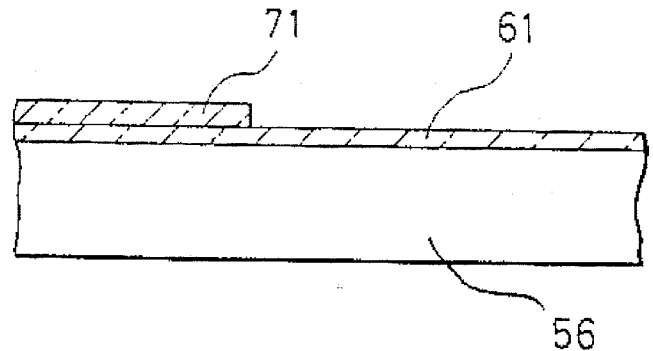
FIGS. 3A to 3H are cross-sectional views showing the fabrication process sequence of the conventional semiconductor device shown in FIGS. 1 and 2, respectively.
Figure 3B:
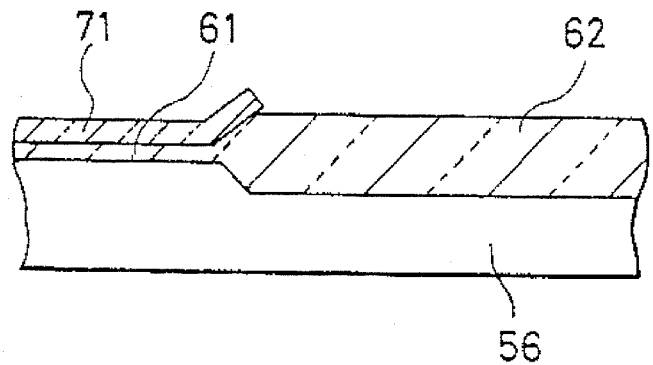
Figure 3C:
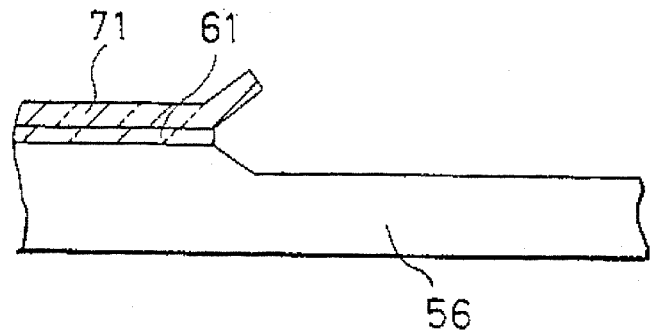
Figure 3D:
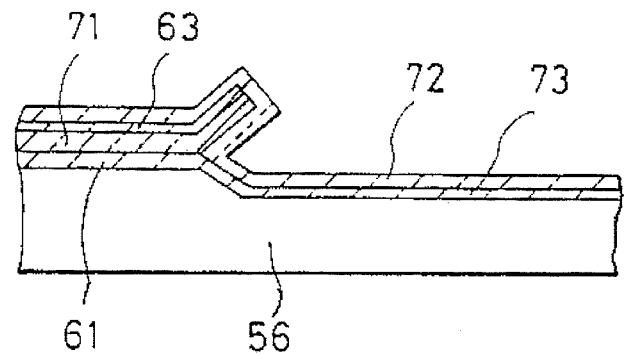
Figure 3E:
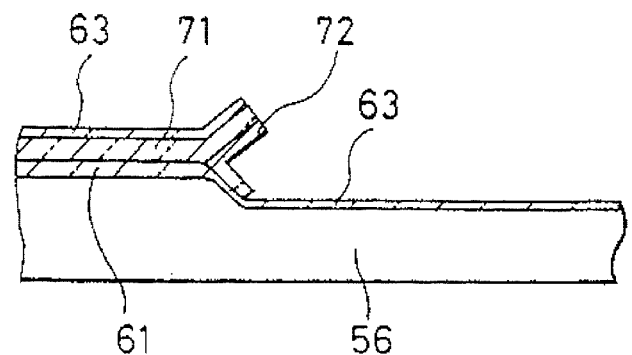
Figure 3F:
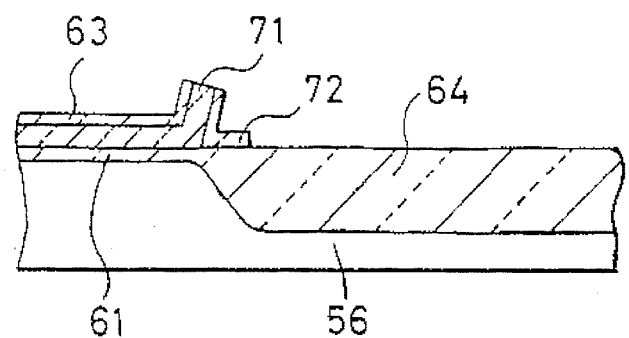
Figure 3G:
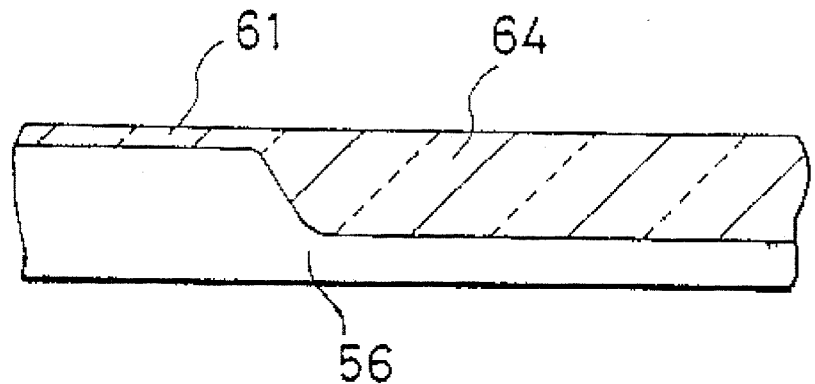
Figure 3H:
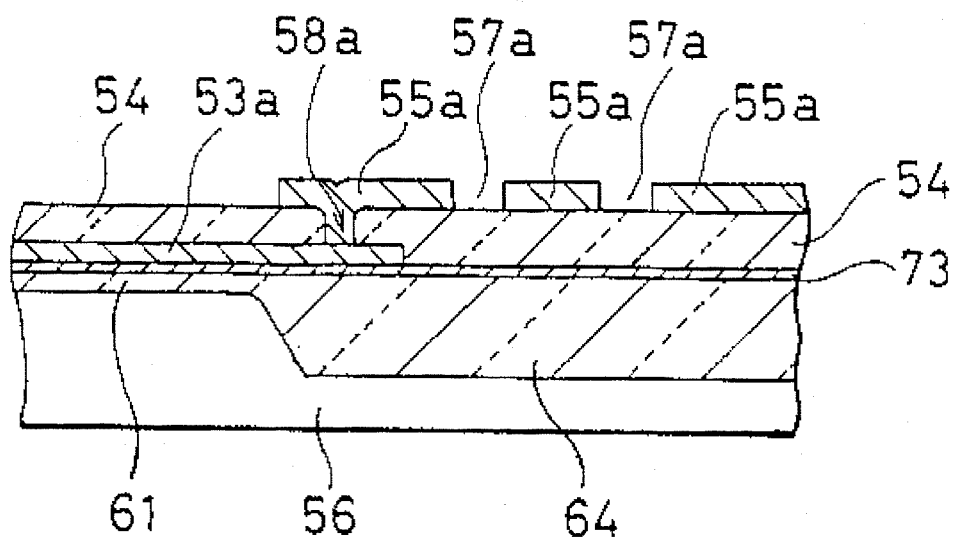

Different from the conventional semiconductor device shown in FIGS. 1 and 2, the second electrodes 5a and 5b do not have openings or apertures.

On the substrate 6, there are provided a thick $SiO_2$ film 14 with a thickness of about 1.5 μm and a thin $SiO_2$ film 11 with a thickness of about 700 Å. The thick film 14 is disposed below the second electrode 5a and is produced by LPCVD. The thin film 11 is disposed below the first electrode 3a and is produced by thermal oxidation of the substrate 6.

An $Si_3N_4$ film 23 is formed to cover the SiOfilms 14 and 11, and the first electrodes 3a and 3b are provided on the $Si_3N_4$ film 23.

Figure 7A:
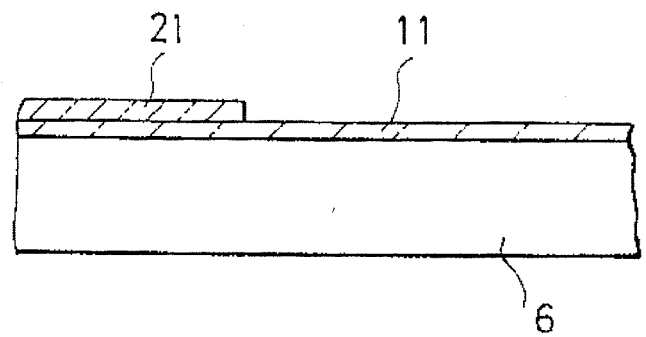
FIG. 7A to 7H are cross-sectional views showing the fabrication process sequence of the semiconductor device of the first embodiment respectively.
Figure 7B:
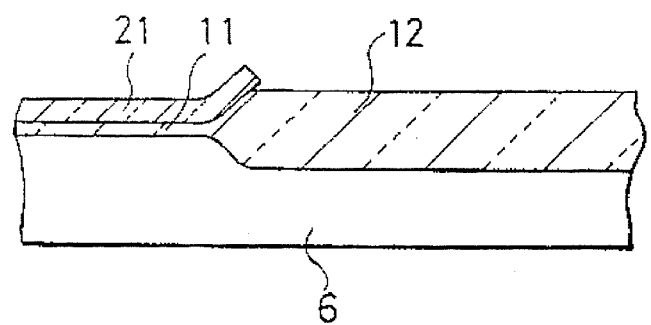
Figure 7C:
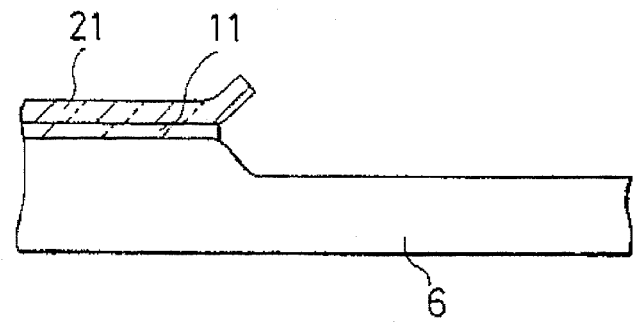
Figure 7D:
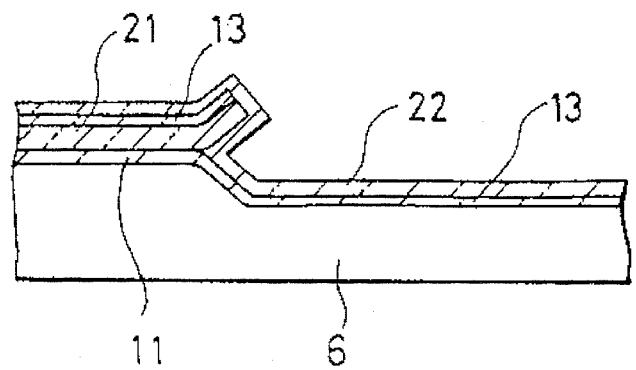
Figure 7E:
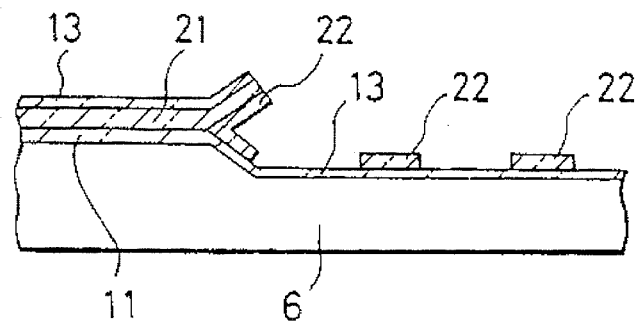
Figure 7F:
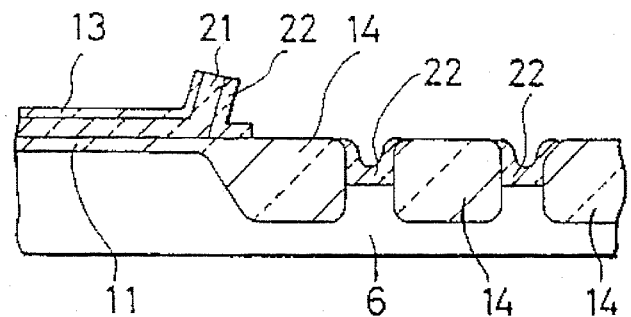
Figure 7G:
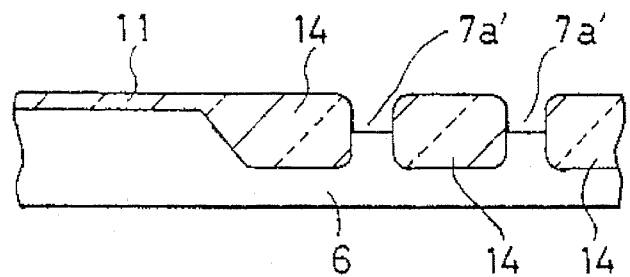

As shown in FIGS. 6 and 7G, the thick $SiO_2$ film 14 has a plurality of square openings or grooves 7a' arranged in a matrix array at intervals. The surface of the substrate 6 exposes from the film 14 through the openings 7a The $Si_3N_4$ film 23 is in contact with the surface of the substrate 6 and the side faces of the $SiO_2$ film 14 in the respective openings 7a'.

The $SiO_2$ interlayer insulator film 4 is not in contact with the $Si_3N_4$ film 23 in the respective openings 7a' and as a result, a plurality of hollow gaps or spaces 7a are formed between the interlayer insulator film 4 and the $Si_3N_4$ film 23 in the respective openings 7a '.

The hollow spaces 7a are arranged in a matrix array at intervals on the film 23. Each of the spaces 7a has a 1 μm×1 μm square planar shape and a depth of about 0.75 μm.

The hollow spaces 7a act to reduce the parasitic capacitance between the second electrode 5a and the substrate 6. This is due to the following fact:

Since the plurality of hollow spaces 7a are provided between the second electrode 5a and the substrate 6, the dielectric material existing between the second electrode 5a and the substrate 6 is not completely solid. The dielectric material, which is formed of the $SiO_2$ interlayer insulator film 4, the $Si_3N_4$ film 23 and the $SiO_2$ film 14, is higher in dielectric constant than the atmosphere.

Therefore, the parasitic capacitor composed of the second electrode 5a, the substrate 6 and the dielectric material when a bonding wire is bonded to the second electrode 5a by wire bonding has a reduced capacitance compared with the case the dielectric material is completely solid.

Such a capacitance-reduction effect due to the dielectric material reduction in the embodiment is superior to that due to the electrode area reduction as shown in the conventional semiconductor device, the obtainable parasitic capacitance becomes less than that of the conventional one, providing improvement in high-frequency characteristic of this device or extra high-frequency bipolar transistor.

For example, the obtainable parasitic capacitance is two-thirds (⅔) of that of the conventional semiconductor device shown in FIGS. 1 and 2.

In addition, since the second electrodes 5a and 5b have no opening, the bonding wires can be bonded to the second electrodes 5a and 5b with sufficient adhesion strength, respectively.

Further, the second electrodes 5a and 5b are extremely difficult to be damaged on wire-bonding because they have no opening.

The semiconductor device of the first embodiment described above is fabricated by the following process sequence:

First, as shown in FIG. 7A, the Si substrate 6 is oxidized thermally to grow an $SiO_2$ film 11 with a thickness of about 700 Å on the entire surface of the substrate 6.

Next, an $Si_3N_4$ film 21 with a thickness of about 1500 Å is formed on the entirety of the $SiO_2$ film 21 by LPCVD, and then, the $Si_3N_4$ film 21 is patterned by photolithography and etching to selectively remove its part where the surface of the substrate 6 is oxidized in the next process step.

The substrate 6 is thermally oxidized again using the patterned $Si_3N_4$ film 21 as a mask so that the $SiO_2$ film 11 selectively grows to be an $SiO_2$ film 12 with a thickness of 1.5 μm on the area where the patterned $Si_3N_4$ film 21 does not exist. Since the $SiO_2$ film 11 usually grows both upper and lower directions, the $Si_3N_4$ film 21 is lifted at the end of the area, as shown in FIG. 7B. The part of the $SiO_2$ film 11 under the $Si_3N_4$ film 21 does not grow.

The $SiO_2$ film 12 thus grown is then removed by etching using the patterned $Si_3N_4$ film 21 as a mask. Since the $SiO_2$ film 11 has grown both upper and lower directions in the same rate, the surface of the area where the $SiO_2$ film 12 has been removed is lower than the original surface of the substrate 6 by about 0.75 82 The state at this time is shown in FIG. 7C.

Subsequently, the substrate 6 is thermally oxidized for a third time to grow an $SiO_2$ film 13 with a thickness of 700 Å over the substrate 6, and an $Si_3N_4$ film 22 with a thickness of about 500 Å is grown by LPCVD on the entirety of the $SiO_2$ film 13 thus grown, as shown in FIG. 7D.

The $Si_3N_4$ film 22 is selectively removed by photolithography and anisotropic etching. As shown in FIG. 7E, the parts of the $Si_3N_4$ film 22 disposed under the mask (not shown) are left on the depressed surface area of the substrate 6, as shown in FIG. 7E. The parts on the depressed surface area have corresponding positions to those of the hollow spaces 7a.

The part of the $Si_3N_4$ film 22 disposed under the lifted end of the $Si_3N_4$ film 21 is also left, as shown in FIG. 7E.

The substrate 6 is then thermally oxidized for a fourth time. Thus, the $SiO_2$ film 13 on the depressed surface area of the substrate 6 grows selectively to be an $SiO_2$ film 14 with a thickness of about 1.5 μm. The $SiO_2$ film disposed on the $Si_3N_4$ film does not grow. The remaining $Si_3N_4$ film 22 changes its form with the growth of the film 14, as shown in FIG. 7F. After that, the $SiO_2$ film 13 and the $Si_3N_4$ films 21 and 22 are removed by etching.

The state of this time is shown in FIG. 7G, where the thick $SiO_2$ film 14 is on the depressed surface area of the substrate 6 and is connected to the thin $SiO_2$ film 11. The thick $SiO_2$ film 14 has the square openings or grooves 7a' arranged in a matrix array at intervals, and the surface of the substrate 6 exposed through the openings 7a'.

Figure 7H:
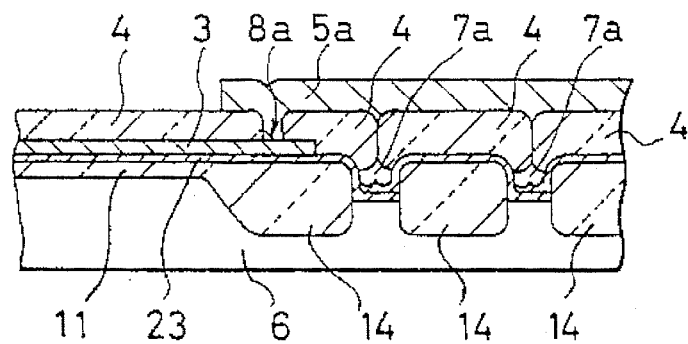

Subsequently, as shown in FIG. 7H, an $Si_3N_4$ film 23 with a thickness of about 500 Å is grown over the substrate 6 by LPCVD to cover the $SiO_2$ films 11 and 14. Then, the first electrodes 3a and 3b are provided on the $Si_3N_4$ film 23 by metallization and patterning to be electrically connected with the base region 1 and the emitter regions 2 in the substrate 6 through contact holes of the $Si_3N_4$ film 23 and the $SiO_2$ film 11, respectively, as shown in FIG. 8.

As shown in FIG. 7H, the $Si_3N_4$ film 23 is in contact with the surface of the substrate 6 and the side faces of the $SiO_2$ film 14 in the respective openings 7a'.

An $Si_3N_4$ film 4 with a thickness of about 1 μm is grown over the substrate 6 by LPCVD as an interlayer insulator film and the contact holes 8a and 8b are formed in the film 4. The $SiO_2$ interlayer insulator film 4 is not in contact with the $Si_3N_4$ film 23 in the respective openings 7a' and as a result, the plurality of hollow gaps or spaces 7a are formed between the interlayer insulator film 4 and the $Si_3N_4$ film 23 in the respective openings 7a'.

Finally, the second electrodes 5a and 5b are formed on the $Si_3N_4$ interlayer insulator film 4 by metallization and patterning. The second electrodes 5a and 5b are interconnected with the first electrodes 3a and 3b through the contact holes 8a and 8b, respectively.

Thus, the semiconductor device of the first embodiment is obtained.

[SECOND EMBODIMENT]

Figure 9:
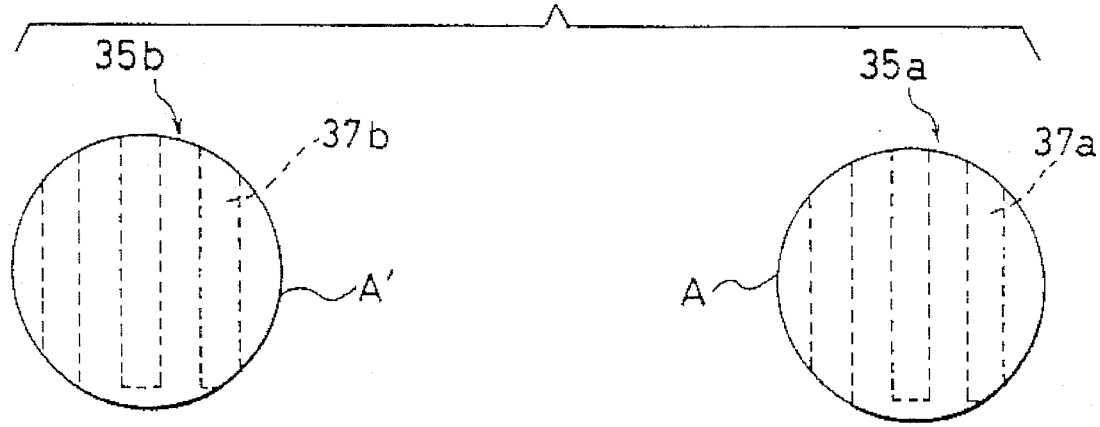
FIG. 9 shows enlarged plan views of the parts A and A' of a semiconductor device according to a second embodiment of the present invention.

FIG. 9 shows a semiconductor device according to a second embodiment.

Here, since the semiconductor device of the second embodiment is the same in configuration as that of the first embodiment excepting that second electrodes 35a and 35b, only the parts A and A' are shown here.

The substrate 6 has hollow spaces 37a and 37b with stripe or slit shapes, which are arranged parallel at intervals under second electrodes 35a and 35b, respectively.

In the second embodiment, the same effects or advantages as those in the first embodiment can be obtained.

[THIRD EMBODIMENT]

Figure 10:
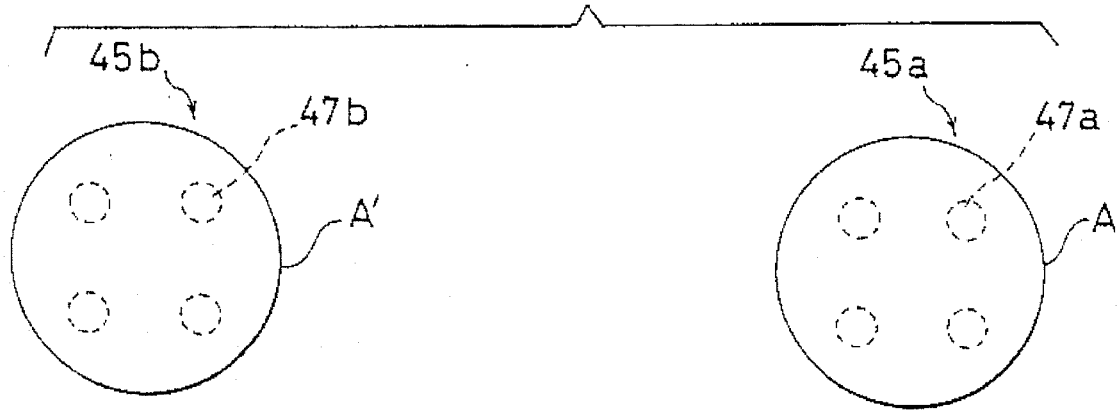
FIG. 10 shows enlarged plan views of the parts A and A' of a semiconductor device according to a third embodiment of the present invention.

FIG. 10 shows a semiconductor device according to a third embodiment.

Here, since the semiconductor device of the third embodiment is the same in configuration as that of the first embodiment excepting that in second electrodes 45a and 45b, only the parts A and A' are shown.

The substrate 6 has hollow spaces 47a and 47b with circular shapes, which are arranged in a matrix array at intervals under second electrodes 45a and 45b, respectively.

In the third embodiment, the same effects or advantages as those in the first embodiment can be obtained.

The semiconductor devices of the first to third embodiments are shown as the bipolar transistors, however, the invention is not limited to the device of this type and any other type of the semiconductor device may be applied.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:

(a) a semiconductor substrate having an active region;

(b) a first electrode formed in a first level, said first level being placed over said substrate, said first electrode being electrically connected to said active region;

(c) an interlayer insulator film formed in a second level, said second level being higher than said first level, said interlayer insulator film covering said first electrode and having an opening; and (d) a second electrode formed in a third level, said third level being higher than said second level, said second electrode acting as a bonding pad and being electrically connected to said first electrode through said opening of said interlayer insulator film;

wherein said interlayer insulator film has a plurality of hollow spaces arranged laterally at intervals between said second electrode and said substrate;

and wherein a parasitic capacitance produced by said second electrode and said substrate is reduced by said spaces because no insulator material is filled into said spaces.

2. A semiconductor device as claimed in claim 1, further comprising a patterned field insulator film formed on said substrate;

wherein said field insulator film is disposed between said substrate and said first level, and has holes penetrating to said substrate;

and wherein said spaces of said interlayer insulator film are formed in said holes.

3. A semiconductor device as claim 2, wherein said field insulator film is placed in a depression of said substrate;

and wherein said spaces of said interlayer insulator film are disposed in said depression.

4. A semiconductor device as claimed in claim 1, wherein all of said spaces are isolated from each other.

5. A semiconductor device as claimed in claim 1, wherein said spaces laterally extend in parallel along a direction.

* * * * *